Jan. 7, 1969 R. R. REISER 3,421,019

FAST TRANSITION AND GATE

Filed July 9, 1965

INVENTOR
RALPH R. REISER

BY A. C. Smith

ATTORNEY

United States Patent Office 3,421,019

Patented Jan. 7, 1969

3,421,019
FAST TRANSISTION AND GATE

Ralph R. Reiser, San Jose, Calif., assignor to Hewlett-Packard Company, Palo Alto, Calif., a corporation of California Filed July 9, 1965, Ser. No. 470,734

U.S. Cl. 307—218 7 Claims

Int. Cl. H03k *19/22*

ABSTRACT OF THE DISCLOSURE

Two transistors having their bases connected in common are biased to a nonconductive signal condition. Separate diodes are connected between the emitters of these transistors and a source of reference potential. These diodes are poled so that each transistor is biased to a conductive signal condition in response to application of an input signal to its emitter and a control signal to its base. Another diode is connected between the bases of both transistors and the source of reference potential to prevent the transistors from conducting in response to application of the control signal alone.

This invention relates to gating circuits, and more particularly, to a fast transistion AND gate.

It is the principal object of this invention to provide a fast transition AND gate which may be used singly, or in combination with at least one similar AND gate to form a multi-channel gate controlled by one signal source without mixing the input and output signals associated with each channel.

In accordance with the illustrated embodiment of this invention, there is provided a gate for producing an output signal when control and input signals of selected polarity are applied thereto within a selected minimum time interval. This gate comprises a transistor with a pair of diodes (having a common terminal connected to a source of reference potential) connected between its base and emitter electrodes and poled so that the transistor is turned on when both of the diodes are forward biased. The control signal is coupled to the base electrode of the transistor for forward biasing one of the diodes, and the input signal is coupled to the emitter electrode of the transistor for forward biasing the other diode. The transistor is responsive to the forward biasing of the base-emitter junction to supply the output signal at its collector electrode.

Figure 1:
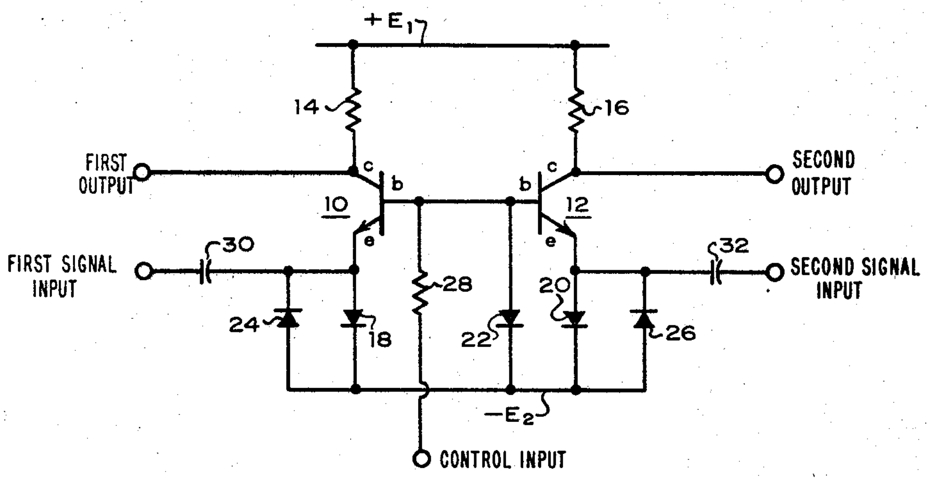
Figure 2:
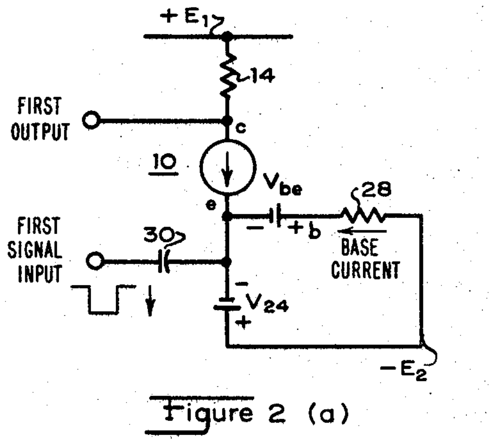
Figure 2:
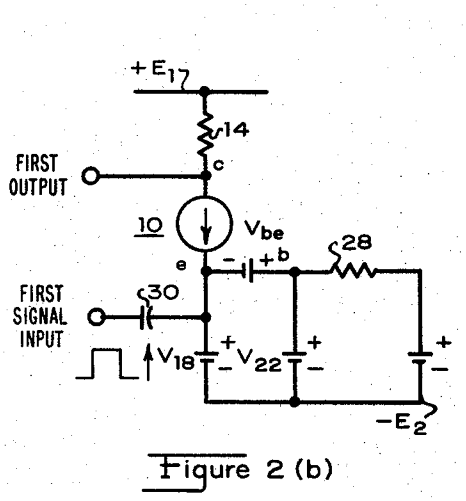
Figure 2:
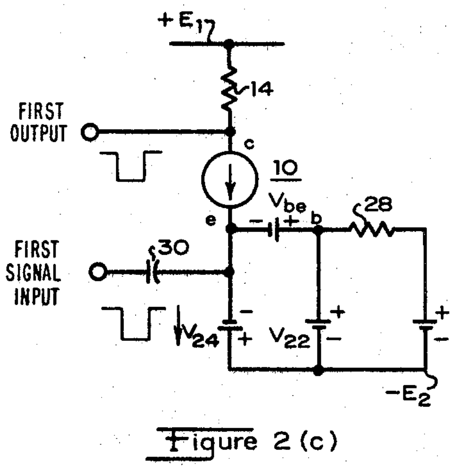

Other and incidental objects of this invention will become apparent from a reading of this specification and an inspection of the accompanying drawing in which:

FIGURE 1 is a schematic diagram of a multi-channel AND gate according to this invention; and FIGURE 2 shows a plurality of equivalent circuits illustrating different modes of operation of one channel of the multi-channel AND gate of FIGURE 1.

Referring to FIGURE 1, there is shown a dual channel AND gate comprising two transistors 10 and 12. Though NPN transistors are shown in the drawing, the gate may be constructed with either NPN or PNP transistors. The collector electrodes *c* of transistors 10 and 12 are connected through load resistors 14 and 16, which may be varied for impedance matching, to a power supply terminal of potential $+E_1$. Similarly, the emitter electrodes *e* of transistors 10 and 12 are connected through diodes 18 and 20 to a power supply terminal of potential $-E_2$. These diodes 18 and 20 are connected to clamp positive-going signals that may be applied to the respective emitter electrodes *e* of transistors 10 and 12 to potential $-E_2$. This protects the base-emitter junctions of transistors 10 and 12 from the destructive effects of excessive back bias voltages and restores the emitter electrodes of the transistors 10 and 12 to their preactivated potential. The base electrodes *b* of transistors 10 and 12 are connected in common. Diodes 22 and 24 are connected between the base and emitter electrodes of transistor 10, and diodes 22 and 26 are similarly connected between the base and emitter electrodes of transistor 12. The common terminal of diodes 22, 24, and 26 is connected to the power supply terminal of potential $-E_2$. All of the diodes 18 through 26 and the transistors 10 and 12 are made of the same semiconductor material. A resistor 28 connects the common base electrodes *b* of transistors 10 and 12 to a control input, and capacitors 30 and 32 connect the emitter electrodes *e* to first and second signal inputs, respectively. First and second outputs are connected to the respective collector electrodes *c* of transistors 10 and 12.

It is apparent that each channel of the gate operates in the same manner. Thus, its operation is hereafter illustrated solely for the application of signals to the first signal input. When the control input is connected to potential $-E_2$ (or a more negative potential) and either no-signal or a positive-going pulse is applied to the first signal input, no pulse is supplied at the first output because the base-emitter junction of transistor 10 is back biased to cut-off. This is also true when a negative-going pulse is applied to the first signal input, as indicated by the equivalent circuit of the first channel of the gate shown in FIGURE 2(*a*). The leading edge of the negative-going pulse forward biases diode 24. Thus, the potential at the emitter electrode of transistor 10 is more negative than $-E_2$ by the potential drop $V_{24}$ across diode 24. However, where both transistor 10 and diode 24 are made of the same material, this does not sufficiently forward bias the base-emitter junction to turn transistor 10 on, since the base electrode of transistor 10 is also more negative than $-E_2$ by the potential drop developed across resistor 28 both by the base current flowing therethrough and the negative potential applied at the control input.

When the control input is connected to a potential which is more positive than $-E_2$ and either no-signal or a positive-going pulse is applied to the first signal input, no pulse is supplied to the first output. This is illustrated by the equivalent circuit for this condition, shown in FIGURE 2(*b*). Diode 22 is forward biased by the control signal so that the potential at the base electrode of transistor 10 is more positive than $-E_2$ by the potential rise $V_{22}$ across diode 22. However, where both diodes 22 and 18 are made of the same material, this does not sufficiently forward bias the base-emitter junction to turn transistor 10 on, since the emitter electrode of transistor 10 is also more positive than $-E_2$ by the potential rise $V_{18}$ across diode 18.

When the control input is connected to a potential which is more positive than $-E_2$ and a negative-going pulse is then applied to the first signal input, a negative-going pulse is also supplied to the first output, because the base-emitter junction of transistor 10 is sufficiently forward biased to turn the transistor on. This is illustrated by the equivalent circuit shown in FIGURE 2(*c*). Diode 22 is forward biased by the control signal so that the base electrode of transistor 10 is more positive than $-E_2$ by the potential rise $V_{22}$ across diode 22. Similarly, diode 24 is forward biased by the leading edge of the negative-going pulse applied at the first signal input so that the emitter electrode *e* of transistor 10 is more negative than $-E_2$ by the potential drop $V_{24}$ across diode 24. This difference in potential between the base and emitter electrodes of transistor 10 sufficiently forward biases the base emitter junction to turn the transistor on and produce a non-inverted signal at the first output. The duration of this output pulse is equal to the rise time of the negative-going pulse applied at the first signal input. The magnitude of the output pulse is controlled by varying capacitor 30, the magnitude of the voltage applied at the control input, or the value of resistor 28.

The common base configuration of this multi-channel AND gate makes it a very fast transition gate. Another advantage of this multi-channel AND gate is that all channels are controlled by a single source of control signal without mixing of the input and output signals from the different channels. A further advantage of this gate is that is consumes little or no power until it is activated.

I claim:

1. A gating circuit comprising:

a transistor having base, emitter, and collector electrodes;

means for biasing said transistor to a first signal condition, said means including a point of reference potential;

first input means connected to said emitter electrode for applying an input signal thereto;

second input means connected to said base electrode for applying a control signal thereto;

a first diode connected between said emitter electrode and said point of reference potential, said first diode being poled in a direction to bias said transistor to a second signal condition when the input signal is applied to said emitter electrode during application of the control signal to said base electrode;

a second diode connected between said base electrode and said point of reference potential, said second diode being poled in a direction to prevent said transistor from being biased to the second signal condition in response to the control signal unless the input signal is applied to said emitter electrode during application of the control signal to said base electrode; and output means including said collector electrode for providing an output signal indicating the operation of said transistor in said second signal condition.

2. A gating circuit as in claim 1 wherein:

said first input means includes a capacitive element for A-C coupling an input signal to said emitter electrode; and said first and second diodes are poled in opposite directions relative to said point of reference potential.

3. A gating circuit as in claim 2 including a third diode connected between said emitter electrode and said point of bias potential, said third electrode being poled in the same direction as said second diode relative to said point of reference potential.

4. A gating circuit comprising:

first and second transistors each having base, emitter, and collector electrodes;

means for biasing said transistors to a first signal condition, said means including a point of reference potential;

first input means connected to the emitter electrode of said first transistor for applying an input signal thereto;

second input means connected to the emitter electrode of said second transistor for applying an input signal thereto;

a control input connected to the bases of said first and second transistors for applying a control signal thereto;

a first diode connected between the emitter electrode of said first transistor and said point of reference potential, said first diode being poled in a direction to bias said first transistor to a second signal condition when an input signal is applied to the emitter electrode of said first transistor during application of a control signal to the base electrode of said first transistor;

a second diode connected between the emitter electrode of said second transistor and said point of reference potential, said second diode being poled in a direction to bias said second transistor to the second signal condition when an input signal is applied to the emitter electrode of said second transistor during application of the control signal to the base electrode of said second transistor;

a third diode connected between said point of reference potential and a point common to the bases of said first and second transistors, said third diode being poled in a direction to prevent each of said first and second transistors from being biased to the second signal condition in response to the control signal until an input signal is applied to its emitter electrode during application of a control signal to its base electrode;

first output means including the collector electrode of said first transistor for providing an output signal indicating the operation of said first transistor in said second signal condition; and second output means including the collector electrode of said second transistor for providing an output signal indicating the operation of said second transistor in said second signal condition.

5. A gating circuit as in claim 4 wherein:

said first and second diodes are poled in the same direction relative to said point of reference potential; and said third diode is poled in the opposite direction relative to said point of reference potential.

6. A gating circuit as in claim 5 wherein:

said first input means includes a capacitive coupling element for A-C coupling an input signal to the emitter electrode of said first transistor; and said second input means includes a capacitive coupling element for A-C coupling an input signal to the emitter electrode of said second transistor.

7. A gating circuit as in claim 6 including:

a fourth diode connected between the emitter electrode of said first transistor and said point of reference potential, said fourth diode being poled in the same direction as said third diode relative to said point of reference potential; and a fifth diode connected between the emitter electrode of said second transistor and said point of reference potential, said fifth diode being poled in the same direction as said third and fourth diodes relative to said point of reference potential.

References Cited

UNITED STATES PATENTS

| | | | |
|---|---|---|---|
| 3,089,091 | 5/1963 | Lindenthal | 307—243 X |
| 3,099,787 | 7/1963 | Elovic | 307—254 X |
| 3,162,817 | 12/1964 | MacIntyre | 328—171 X |

OTHER REFERENCES

Hurley: Junction Transistor Electronics, 1958, pp. 400 to 402.

ARTHUR GAUSS, *Primary Examiner.*

DONALD D. FORRER, *Assistant Examiner.*

U.S. Cl. X.R.

307—237, 241, 253, 254